(12) United States Patent
Gahtori et al.

(10) Patent No.: US 9,865,791 B2
(45) Date of Patent: Jan. 9, 2018

(54) NANOSTRUCTURED COPPER-SELENIDE WITH HIGH THERMOELECTRIC FIGURE-OF-MERIT AND PROCESS FOR THE PREPARATION THEREOF

(71) Applicant: Council of Scientific & Industrial Research, New Dehli (IN)

(72) Inventors: Bhasker Gahtori, New Delhi (IN); Sivaiah Bathula, New Dehli (IN); Kriti Tyagi, New Dehli (IN); Avanish Kumar Srivastava, New Dehli (IN); Ajay Dhar, New Dehli (IN); Ramesh Chandra Budhani, New Dehli (IN)

(73) Assignee: Council of Scientific & Industrial Research, New Delhi (IN)

( * ) Notice: Subject to any disclaimer, the term of this patent is extended or adjusted under 35 U.S.C. 154(b) by 115 days.

(21) Appl. No.: 15/021,661

(22) PCT Filed: Mar. 12, 2014

(86) PCT No.: PCT/IN2014/000161
§ 371 (c)(1),
(2) Date: Mar. 11, 2016

(87) PCT Pub. No.: WO2015/037014
PCT Pub. Date: Mar. 19, 2015

(65) Prior Publication Data
US 2016/0225972 A1    Aug. 4, 2016

(30) Foreign Application Priority Data
Sep. 12, 2013   (IN) .......................... 2693/DEL/2013

(51) Int. Cl.
*C01B 19/00* (2006.01)
*H01L 35/16* (2006.01)
(Continued)

(52) U.S. Cl.
CPC ............ *H01L 35/16* (2013.01); *C01B 19/007* (2013.01); *H01L 35/26* (2013.01); *B82Y 30/00* (2013.01);
(Continued)

(58) Field of Classification Search
CPC .............................. H01L 35/06; C01B 19/007
(Continued)

(56) References Cited

U.S. PATENT DOCUMENTS

| | | | |
|---|---|---|---|
| 2006/0235087 A1 | 10/2006 | Alexandridis et al. | |
| 2013/0234375 A1* | 9/2013 | Ren | H01L 35/34 264/614 |
| 2016/0181497 A1* | 6/2016 | Ko | H01L 35/34 252/512 |

OTHER PUBLICATIONS

Bathula, et al. 2012 "Enhanced thermoelectric figure-of-merit in spark plasma sintered nanostructured n-type SiGe alloys" *Applied Physics Letters* 101(21): 213902-213902.
(Continued)

*Primary Examiner* — Matthew E Hoban
(74) *Attorney, Agent, or Firm* — Knobbe, Martens, Olson & Bear, LLP (57) ABSTRACT

Disclosed is a nanostructured p-type copper-selenide as a cost-effective thermoelectric material with a high thermoelectric figure-of-merit. The nanostructured copper-selenide is a cost-effective p-type thermoelectric material having a high figure-of-merit of 2 at 973 K and is synthesized employing high energy ball milling process followed by reaction sintering under pressure at high heating rates using spark plasma sintering of the resulting nanopowders. The sintered copper-selenide shows a density of 99.9% of theoretical density and retains the nanoscale features introduced during ball milling leading to a thermoelectric figure of merit of 2 at 973 K.

9 Claims, 6 Drawing Sheets (51) Int. Cl.
*H01L 35/26* (2006.01)
*B82Y 30/00* (2011.01)

(52) U.S. Cl.
CPC ...... *C01P 2002/60* (2013.01); *C01P 2002/74* (2013.01); *C01P 2004/03* (2013.01); *C01P 2004/64* (2013.01); *C01P 2006/40* (2013.01)

(58) Field of Classification Search
USPC .................................................. 252/62.3 T
See application file for complete search history.

(56) References Cited

OTHER PUBLICATIONS

Yu, et al. 2012 "Thermoelectric properties of copper selenide with ordered selenium layer and disordered copper layer" *Nano Energy* 1(3): 472-478.

Liu, et al. 2012 "Copper ion liquid-like thermoelectrics" *Nature Materials* 11(5): 422-425.

Liu, et al. 2013 "Ultrahigh Thermoelectric Performance by Electron and Phonon Critical Scattering in $Cu_2Se_{1-x}I_x$," *Advanced Materials* 25(45): 6607-6612.

Ballikaya, et al. 2013 "Thermoelectric properties of Ag-doped $Cu_2Se$ and $Cu_2Te$" *Journal of Materials Chemistry* 1(40): 12478.

Zhang, et al. 2010 "Synthesis and Thermoelectric Property of $Cu_{2-x}Se$ Nanowires" *Journal of Physical Chemistry* 114(35): 14849-14853.

Xing-Xing, et al. 2011 "Phase transition and high temperature thermoelectric properties of copper selenide $Cu_{2-x}Se$ ($0 \leq x \geq 0.25$)*" *Chin. Phys. B;* 20(8): 087201(1)-087201(8).

\* cited by examiner

NANOSTRUCTURED COPPER-SELENIDE WITH HIGH THERMOELECTRIC FIGURE-OF-MERIT AND PROCESS FOR THE PREPARATION THEREOF

FIELD OF THE INVENTION

The present invention relates to a process for the synthesis of nanostructured p-type copper-selenide as a non-toxic thermoelectric material with a high thermoelectric figure-of-merit. Particularly, the present invention relates to an improved process for the synthesis of nanostructured p-type β-phase copper-selenide ($Cu_2Se$) with high thermoelectric figure-of-merit of 2 at 973 K useful as p-type thermoelectric element in thermoelectric device for generation of electricity.

BACKGROUND OF THE INVENTION

Thermoelectric devices convert waste heat into electricity the conversion efficiency of which depends on the thermoelectric material's figure-of-merit. The thermoelectric figure of merit (ZT) is given by, $ZT=S^2\sigma T/\kappa$, where S is the Seebeck coefficient, $\sigma$ is the electrical conductivity, $\kappa$ the thermal conductivity and T is the temperature.

Most of the currently available thermoelectric materials have lower figure-of-merit leading to low conversion efficiency of the thermoelectric device and thus these materials have limited commercial applications. The highest value of thermoelectric figure of merit ~2.2 reported thus far is for Lead-Silver-Antimony-Tellurium (LAST) alloy. However, LAST alloy contains Lead which is very toxic, Silver and Tellurium which are quite expensive. In contrast, the thermoelectric material nanostructured $Cu_2Se$, described in this invention, is relatively cheap and non-toxic material with a high thermoelectric figure of merit of 2.

$Cu_2Se$ is a known thermoelectric material in the literature, and has been synthesized by three different research groups.

Reference may be made to Journal Xiao Xing-Xing et. al. (Chin. Phys. B, vol. 20 (2011) pp. 087201, wherein the synthesis of Cu2Se was carried out by melting high purity Copper and Selenium powders in the desired ratios and sealed in a quartz tubes under vacuum and the tubes were heated up to 1403 K at a heating rate of 2K/min and held at this temperature for another 10 hours, then quenched on cold salt water. The obtained ingot were pulverized into powder and then sintered by a spark plasma sintering technique at 973 K under a pressure of 35 MPa for 7 minutes. The resulting material exhibited a highest ZT of 0.38 at 750 K.

Reference may be made to Journal Huili Liu et al. (Nature Materials, vol. 11 (2012) pp. 422-425), wherein the $Cu_2Se$ Polycrystalline samples were prepared by melting the 99.999% pure Cu and Se elements in a pyrolitic boron nitride crucible enclosed in a fused silica tube at 1,423K for 12 h in vacuum, and then slowly cooled down to 1,073K in 24 h and held there for seven days. Finally, the tubes were furnace cooled to room temperature. The resulting ingots were ground into a fine powder by hand using an agate jar and plunger and subjected to spark plasma sintering around 710K under a pressure of 65 MPa. The resulting $Cu_2Se$ materials exhibited a ZT of 1.5 at 1000 K.

Reference may be made to Journal Bo Yu et. al (Nano Energy, vol. 1 (2012, pp. 472-478) wherein $Cu_2Se$ nanopowders were synthesized from Cu (99.5% pure), and Se (99.99% pure) elements through high-energy ball milling. Bulk samples were fabricated by consolidating the as-prepared nanopowders in a graphite die using a conventional hot pressing method.

In the above references of Xiao Xing-Xing et. al (Chin. Phys. B, vol. 20 (2011) pp. 087201 and Huili Liu et al. (Nature Materials, vol. 11 (2012) pp. 422-425), Cu2Se bulk material was prepared by melting route, wherein in the present invention we have synthesized nanostructured Cu2Se. Although Bo Yu et al. (Nano Energy, vol. 1 (2012, pp. 472-478) have prepared nanostructured Cu2Se by ball milling, but they have sintered these nanopowders by hot pressing route, which is known to result in grain growth. On the contrary, in this invention we have prepared the Cu2Se nanopowders by ball milling, which is then followed by the spark plasma sintering, which has the advantage of fast sintering, producing products with very high density and is known to retain the nanostructure in Cu2Se, leading a to high value 2 for ZT. This value of ZT of 2 in the present invention is the highest reported so far in the literature for nanostructured copper-selenide.

OBJECTIVES OF THE INVENTION

The main object of the present invention is to provide a process for the synthesis of nanostructured copper-selenide thermoelectric material.

Another object of the present invention is to provide a nanostructured copper-selenide compound with a high thermoelectric figure of merit of 2 at 973 K.

Yet another object of the present invention is to provide p-type thermoelectric materials for usage in a thermoelectric device.

Yet another object of the present invention is to provide a cost-effective and non-toxic, thermoelectric material with high thermoelectric figure of merit Yet another object of the present invention is to provide a quick process wherein the nanostructured copper-selenide is synthesized using rapid heating rates for a short duration employing spark plasma sintering technique.

SUMMARY OF THE INVENTION

Accordingly, present invention provides a nanostructured copper-selenide having formula $Cu_XSe_{X-1}$ wherein X is in the range of 1.99 to 2.01 atomic ratio; wherein the copper-selenide is a p-type thermoelectric material with high thermoelectric figure-of-merit of 2 at 973K.

In an embodiment, present invention provides nanostructured copper-selenide having an average crystallite size in the range of 5 nm to 30 nm.

In another embodiment, present invention provides a process for the synthesis of nanostructured copper-selenide as a p-type thermoelectric material with high thermoelectric figure-of-merit of 2 at 973K and the said process comprising the steps of:
  i. mixing copper and selenium powders in the atomic ratio ranging between 1.97 to 2.03 to obtain a mixture;
  ii. milling the mixture as obtained in step (i) by using balls in high energy ball mill with 2 to 4 weight percent process control reagent at a speed of 300 to 400 rpm for period in the range of 40 to 70 hrs to obtain Cu and Se nanopowders;
  iii. compacting the nanopowder as obtained in step (ii) on a hydraulic press at an pressure of 0.3 to 0.5 MPa to obtain compacted pellet;
  iv. consolidating the compacted pellet as obtained in step (iii) using spark plasma sintering process in vacuum for period in the range of 3 to 5 minutes followed by cooling and releasing the pressure to obtain nanostructured copper-selenide In an embodiment of the present invention, ball to powder weight ratio is in the range of 15:1 to 20:1.

In another embodiment of the present invention, Cu and Se nanopowders were compacted in 12.7 mm inner diameter high strength graphite.

In yet another embodiment of the present invention, process control reagent used is a stearic acid.

In yet another embodiment of the present invention, spark plasma sintering process is carried out at a pressure of 50 to 80 MPa.

In yet another embodiment of the present invention, spark plasma sintering process is carried out at a temperature in the range of 800 to 900 K with heating rate of 300 to 450 K/min in vacuum of 3 to 8 Pa in a high-strength graphite die.

In yet another embodiment of the present invention, milling is carried out in inert atmosphere of argon gas.

BRIEF DESCRIPTION OF THE DRAWINGS

FIG. 7 represents high resolution transmission electron micrographs (HRTEM) for nanostructured $Cu_2Se$. It was noted that the microstructure was ultra-fine grained with individual grains normally abutting each other (FIG. 7a). The extent of overlay with neighboring grains is such that the interference Moiré fringes, evolved due to overlap of crystallographic planes of individual crystallites, were clearly visible (region marked as "A" in FIG. 7a). Inset in FIG. 7a showing the magnified image of region "A" delineates a set of crystallographic planes with inter-planar spacing of 0.22 nm (hkl:090) of monoclinic crystal structure (lattice constants: a=7.143 Å, b=12.39 Å, c=27.33 Å, B=94.40°). Further, atomic scale images and reciprocal space analyses have assisted in resolving fine intricacies in the microstructure with the individual nano-sized crystallites and their respective boundaries. FIG. 7b exhibits the occurrence of three randomly oriented nanocrystallites with inter-planar spacing of 0.36 nm (hkl:211), 0.33 nm (hkl:221) and 0.19 nm (hkl:411) of a monoclinic crystal. The presence of (211) and (221) is large in fraction as compared to (411) which may be correlated to density of particular set of planes due to preferred orientation growth during synthesis. A corresponding Fast Fourier Transform (FFT) recorded from these nanocrystalline aggregates reveals that these are in random orientation with respect to each other as manifested by the formation of Debye rings in reciprocal space. The presence of the inter-planar spacings 0.36, 0.33 and 0.19 nm corresponding to the planes (211), (221), and (411), respectively, are marked on FFT pattern (inset in FIG. 7b). It was noted that most of these nanocrystals have a clear boundary at the interfaces, as depicted in FIG. 7c. A corresponding FFT pattern recorded on cluster of these nanocrystals elucidates the presence of the planes 221 (d-spacing: 0.33 nm) and 220 (d-spacing: 0.21 nm) in reciprocal space (inset in FIG. 7c).

FIG. 7(d) shows the statistical crystallite size distribution estimated from crystallites in several regions of the specimen which revealed an average crystallite size of about ~14 nm.

DETAILED DESCRIPTION OF THE INVENTION

Present invention provides a two step process for the synthesis of nanostructured p-type copper-selenide with a high thermoelectric figure of merit of 2.

Copper and Selenium powders were mixed in chemical stiochiometric proportions and milled in a high energy planetary ball mill hardened stainless steel grinding jars and grinding balls for 50 hours at a speed of 400 rpm, resulting in their nanostructured powders. Nanostructured powders consolidated and sintered employing spark plasma sintering at 973 K at a pressure of 60 MPa with a heating rate of 573 K/min in a 12.7 mm inner diameter high-strength graphite die and punches 6.168 gm of Cu powder (99.99%, Alfa Aesar) and 3.832 gm of Se powders (99.99%, Alfa Aesar) were mixed in and milled in a high energy planetary ball mill with 0.2 gm of Stearic acid powder in 250 ml grinding jars made of hardened stainless steel and using 10 mm diameter grinding balls also made of ball hardened stainless in ball to powder weight ratio of 15:1 for 50 hours at a speed of 400 rpm, in an inert atmosphere of argon gas, resulting in the nanostructured powders of Cu and Se.

After ball milling the powders of Cu and Se, were handled only in a glove box under high purity argon to avoid any oxidation and atmospheric contamination. These high energy ball milled nanostructured Cu and Se powders were compacted in 12.7 mm inner diameter high strength graphite on a hydraulic press at an pressure of 0.3 MPa in a form of a pellet.

This compacted pellet of nanostructured Cu and Se nanopowders was then consolidated using spark plasma sintering process at a pressure of 60 MPa and temperature of 873 K with a heating rate of 573K/min in a 12.7 mm inner diameter high-strength graphite die and punches. The spark plasma sintering was carried out for a period of 3 minutes under vacuum of 5 Pa. After spark plasma sintering the sintered pellet of nanostructured Cu and Se powders was naturally cooled and the pressure was released only after the temperature reached the room temperature and then the sample was removed from the graphite die.

Figure 1:
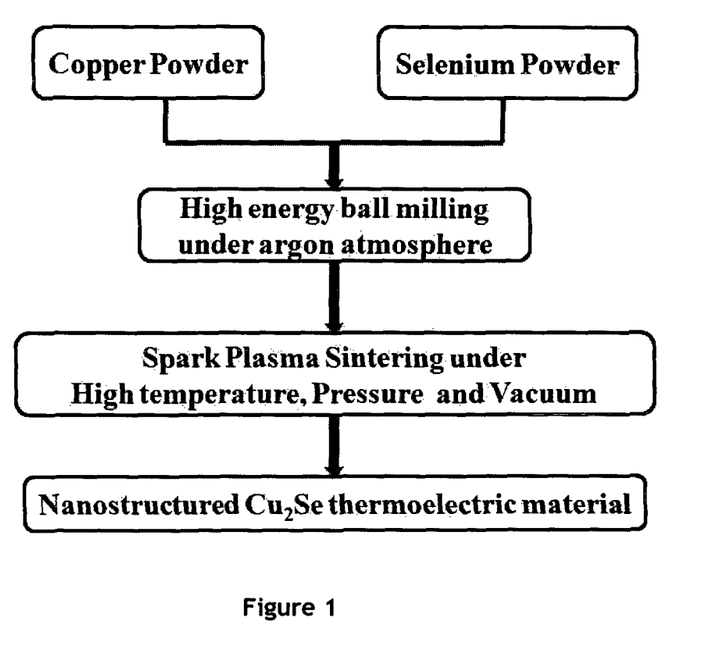
FIG. 1 represents schematic of the experiments steps in the synthesis of nanostructured $Cu_2Se$.
Figure 2:
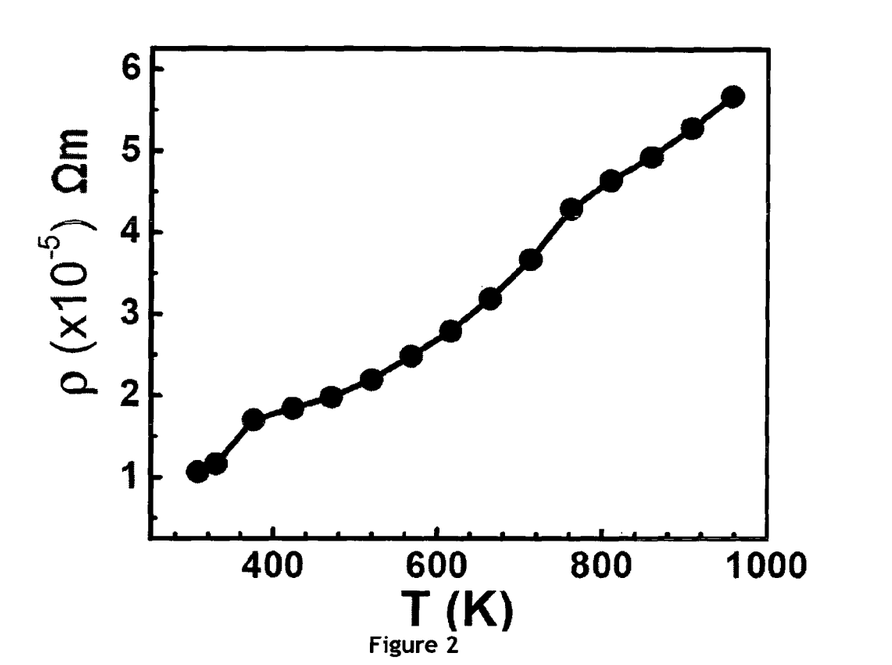
FIG. 2: represents temperature dependence of the measured Electrical Resistivity of Nanostructured $Cu_2Se$.
Figure 3:
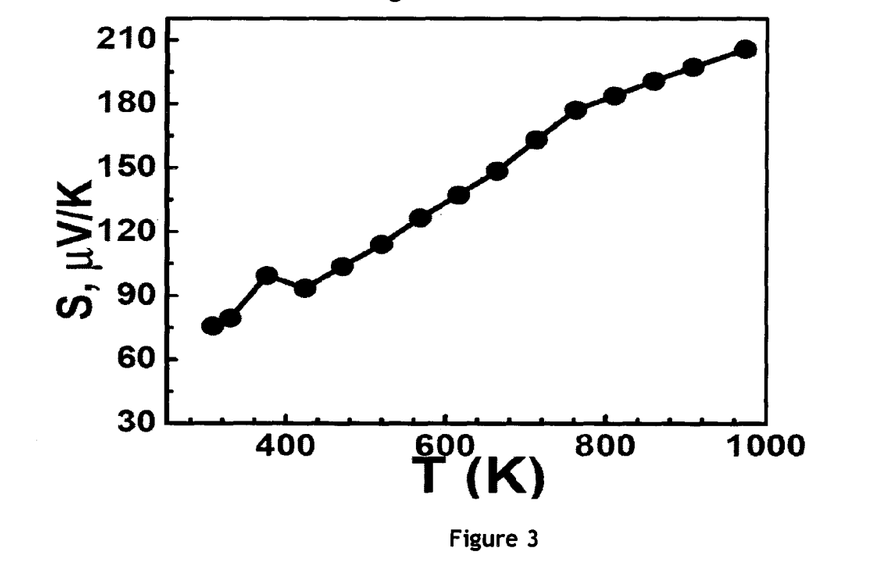
FIG. 3 represents temperature dependence of Seebeck Coefficient of Nanostructured $Cu_2Se$.
Figure 4:
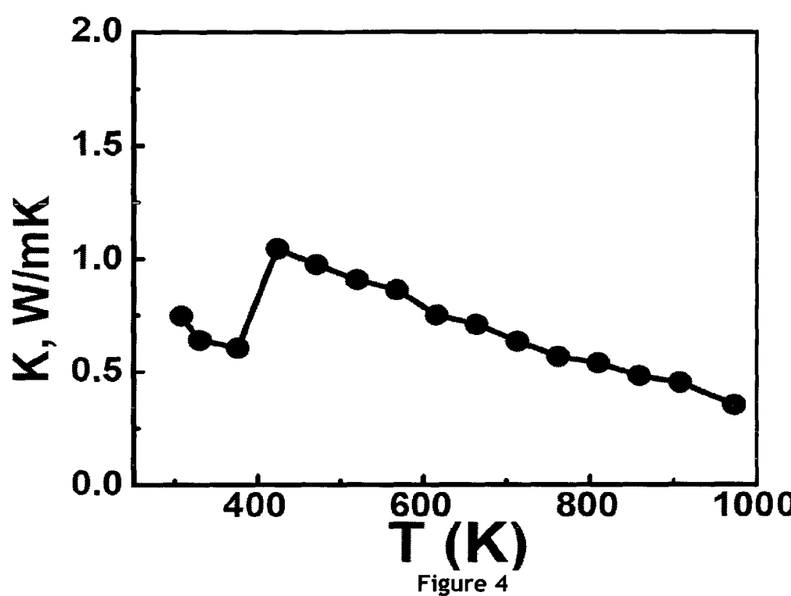
FIG. 4 represents temperature dependence of Thermal Conductivity of Nanostructured $Cu_2Se$.
Figure 5:
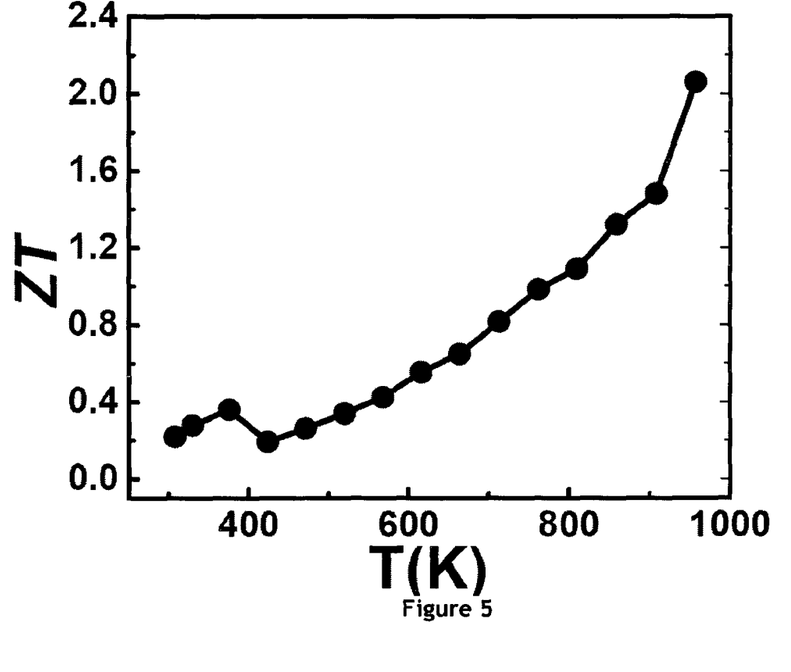
FIG. 5 represents temperature dependence of thermoelectric figure of merit for nanostructured $Cu_2Se$.

The schematic of the experimental process for synthesis of nanostructured $Cu_2Se$ thermoelectric material, is shown in FIG. 1. FIG. 2 shows the measured electrical resistivity of synthesized nanostructured $Cu_2Se$ material as a function of temperature. FIG. 3 shows the measured Seebeck coefficient of the synthesized nanostructured $Cu_2Se$ material as a function of temperature. FIG. 4 shows the calculated thermal conductivity from the measured values thermal diffusivity, specific heat and density of synthesized nanostructured $Cu_2Se$ material, as a function of temperature. FIG. 5 shows the variation of the calculated thermoelectric figure-of-merit from the measured values electrical resistivity, Seebeck coefficient, thermal diffusivity, specific heat and density of the synthesized nanostructured $Cu_2Se$ material, as a function of temperature. FIG. 5 shows the thermoelectric figure-of-merit value of 2 at 973 K.

Figure 6:
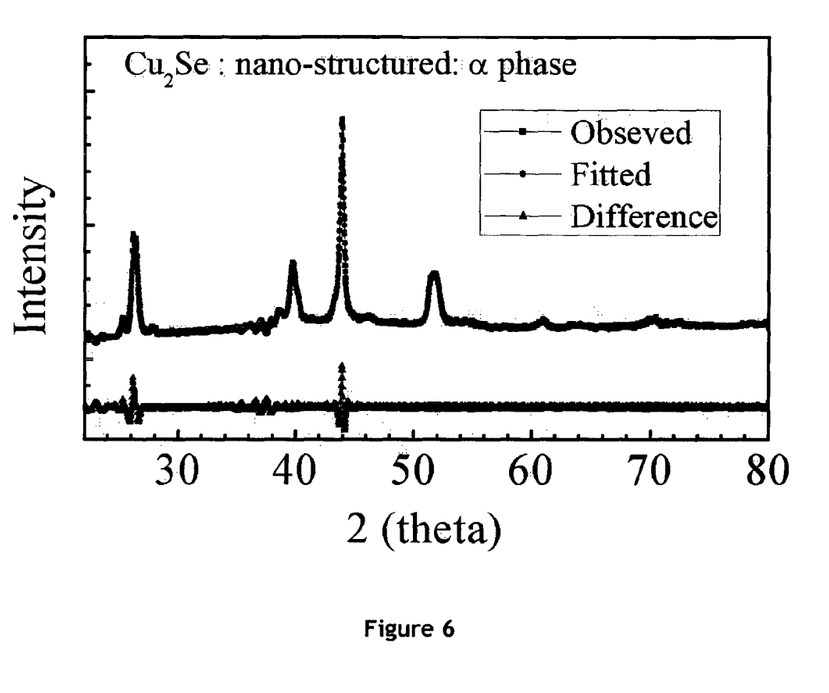
FIG. 6 represents X-ray diffraction pattern for nanostructured $Cu_2Se$ including its rietveld refinement.

FIG. 6 shows the Reitveld refinement plot of X-ray diffraction pattern of $Cu_2Se$ nanostructured samples carried out at room temperature (α-phase). It was observed that the low temperature phase crystallizes in a monoclinic structure with space group C2/c and lattice constants a=7.14 Å, b=12.39 Å, c=27.33 Å and B=94.40° C.

Figure 7:
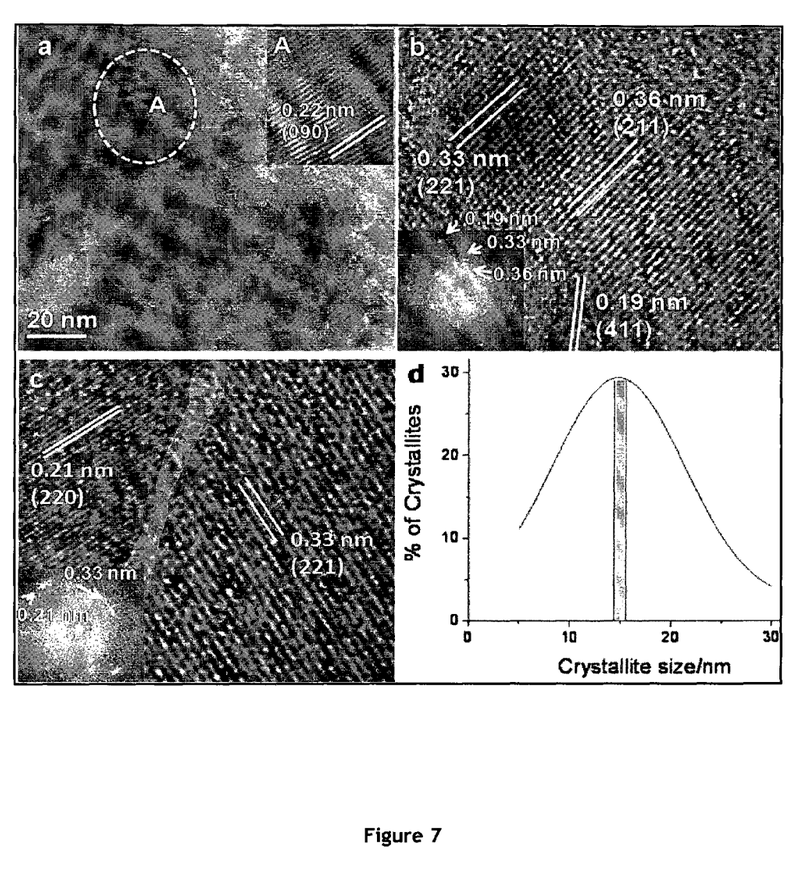

FIG. 7 HRTEM of nanostructured $Cu_2Se$ showing: (a) distribution of fine grains abutting each other, a set of moiré patterns marked as region "A" is evolved due to overlap of tiny crystals mis-oriented by a set of crystallographic planes. Inset in (a) shows atomic scale image of moiré patterns revealing the overlapped planes of monoclinic crystal. (b) Atomic scale image of fine grains distributed randomly with different inter-planar spacings. Inset shows corresponding fast fourier transform (FFT) of atomic scale image revealing the corresponding crystallographic planes in reciprocal space. (c) Atomic scale image of two grains separated by a well defined grain boundary. Inset shows corresponding FFT of atomic scale image revealing the corresponding crystallographic planes in reciprocal space. (d) size distribution of large number of grains measured from different micrographs showing the average size of nan crystallites.

Figure 8:
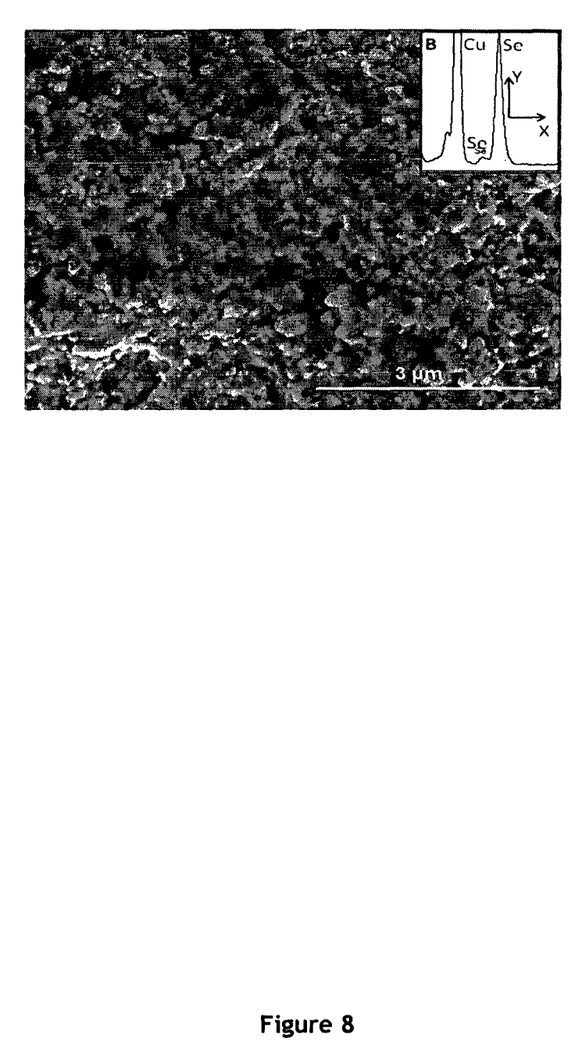
FIG. 8 represents the scanning electron micrograph (SEM) for nanostructured $Cu_2Se$.

FIG. 8 shows the Scanning Electron Micrograph with EDS pattern of nanostructured $Cu_2Se$. SEM micrograph shows an ultra-fine globular morphology of the surface of nanostructured $Cu_2Se$. Inset: EDS pattern showing the presence of Cu and Se.

In this invention, $Cu_2Se$ nanopowders by ball milling have been prepared, which is then followed by the spark plasma sintering, which has the advantage of fast sintering, producing products with very high density and is known to retain the nanostructure in $Cu_2Se$, leading a to high value 2 for ZT, which is the highest known for this material.

The novelty of the present work is to provide an improved process for the synthesis of nanostructured copper-selenide as a p-type thermoelectric material with high thermoelectric figure-of-merit of 2 at 973K. The novelty in the synthesis of nanostructured copper-selenide is that the nanostructured powders of Cu and Se synthesized by ball milling were consolidated employing spark plasma sintering at optimized process parameters.

The inventive steps in the present invention is consolidation sintering of the ball milled nanostructured $Cu_2Se$ by rapid heating rate employing spark plasma sintering process which results in a dense product while retaining the nanostructures generated in $Cu_2Se$ during ball milling, thus leading to high thermoelectric figure of merit in nanostructured copper-selenide.

EXAMPLES

The following examples are given by way of illustration only and should not be constructed to limit the scope of the present invention.

Example 1

6.168 gm of Cu powder (99.99%, Alfa Aesar) and 3.832 gm of Se powders (99.99%, Alfa Aesar) were mixed in and milled in a high energy planetary ball mill with 0.2 gm of Stearic acid powder in 250 ml grinding jars made of hardened stainless steel and using 10 mm diameter grinding balls also made of ball hardened stainless in ball to powder weight ratio of 15:1 for 50 hours at a speed of 400 rpm, in an inert atmosphere of argon gas, resulting in the nanostructured powders of Cu and Se.

After ball milling the powders of Cu and Se were handled only in a glove box under high purity argon to avoid any oxidation and atmospheric contamination. These high energy ball milled nanostructured Cu and Se powders were compacted in 12.7 mm inner diameter high strength graphite on a hydraulic press at a pressure of 0.3 MPa in a form of a pellet.

This compacted pellet of nanostructured Cu and Se nanopowders was then consolidated using spark plasma sintering process at a pressure of 60 MPa and temperature of 873 K with a heating rate of 573K/min in a 12.7 mm inner diameter high-strength graphite die and punches. The spark plasma sintering was carried out for a period of 3 minutes under vacuum of 5 Pa. After spark plasma sintering the sintered pellet of nanostructured Cu and Se powders was naturally cooled and the pressure was released only after the temperature reached the room temperature and then the sample was removed from the graphite die.

Example 2

24.672 gm of Cu powder (99.99%, Alfa Aesar) and 15.328 gm of Se powders (99.99%, Alfa Aesar) were mixed in, and milled in a high energy planetary ball mill with 0.8 gm of Stearic acid powder in 500 ml grinding jars made of hardened stainless steel and using 10 mm diameter grinding balls also made of ball hardened stainless in ball to powder weight ratio of 20:1 for 50 hours at a speed of 400 rpm, in an inert atmosphere of argon gas, resulting in the nanostructured powders of Cu and Se.

After ball milling the powders of Cu and Se were handled only in a glove box under high purity argon to avoid any oxidation and atmospheric contamination. These high energy ball milled nanostructured Cu and Se powders were compacted in 12.7 mm inner diameter high strength graphite on a hydraulic press at a pressure of 0.5 MPa in a form of a pellet.

This compacted pellet of nanostructured Cu and Se nanopowders was then consolidated using spark plasma sintering process at a pressure of 60 MPa and temperature of 873 K with a heating rate of 573K/min in a 12.7 mm inner diameter high-strength graphite die and punches. The spark plasma sintering was carried out for a period of 5 minutes under vacuum of 7 Pa. After spark plasma sintering the sintered pellet of nanostructured Cu and Se powders was naturally cooled and the pressure was released only after the temperature reached the room temperature and then the sample was removed from the graphite die.

Example 3

6.168 gm of Cu powder (99.99%, Alfa Aesar) and 3.832 gm of Se powders (99.99%, Alfa Aesar) were mixed in and milled in a high energy planetary ball mill in 250 ml grinding jars made of hardened stainless steel and using 10 mm diameter grinding balls also made of ball hardened stainless in ball to powder weight ratio of 20:1 for 40 hours at a speed of 400 rpm, in an inert atmosphere of argon gas, resulting in the nanostructured powders of Cu and Se.

After ball milling the powders of Cu and Se were handled only in a glove box under high purity argon to avoid any oxidation and atmospheric contamination. These high energy ball milled nanostructured Cu and Se powders were compacted in 12.7 mm inner diameter high strength graphite on a hydraulic press at an pressure of 0.3 MPa in a form of a pellet.

This compacted pellet of nanostructured Cu and Se nanopowders was then consolidated using spark plasma sintering process at a pressure of 60 MPa and temperature of 873 K with a heating rate of 473K/min in a 12.7 mm inner diameter high-strength graphite die and punches. The spark plasma sintering was carried out for a period of 4 minutes under vacuum of 5 Pa. After spark plasma sintering the sintered pellet of nanostructured Cu and Se powders was naturally cooled and the pressure was released only after the temperature reached the room temperature and then the sample was removed from the graphite die.

Example 4

24.672 gm of Cu powder (99.99%, Alfa Aesar) and 15.328 gm of Se powders (99.99%, Alfa Aesar) were mixed in and milled in a high energy planetary ball mill with 0.6 gm of Stearic acid powder in 500 ml grinding jars made of hardened stainless steel and using 10 mm diameter grinding balls also made of ball hardened stainless in ball to powder weight ratio of 17:1 for 70 hours at a speed of 350 rpm, in an inert atmosphere of argon gas, resulting in the nanostructured powders of Cu and Se.

After ball milling the powders of Cu and Se were handled only in a glove box under high purity argon to avoid any oxidation and atmospheric contamination. These high energy ball milled nanostructured Cu and Se powders were compacted in a 12.7 mm inner diameter high strength graphite on a hydraulic press at an pressure of 0.4 MPa in a form of a pellet.

This compacted pellet of nanostructured Cu and Se nanopowders was then consolidated using spark plasma sintering process at a pressure of 60 MPa and temperature of 873 K with a heating rate of 573K/min in a 12.7 mm inner diameter high-strength graphite die and punches. The spark plasma sintering was carried out for a period of 5 minutes under vacuum of 7 Pa. After spark plasma sintering the sintered pellet of nanostructured Cu and Se powders was naturally cooled and the pressure was released only after the temperature reached the room temperature and then the sample was removed from the graphite die.

Advantages of the Invention

The main advantages of the present invention are:
The nanostructured $Cu_2Se$ thermoelectric material claimed in this invention has a high figure of merit of 2 at 973 K.

This material in the present invention nanostructured $Cu_2Se$ is synthesized using spark plasma sintering techniques with rapid heating rates and the sintering is completed in a short time.

This thermoelectric material, nanostructured $Cu_2Se$, contains constituent elements that are relatively cheap, unlike the existing high figure-of-merit materials which mostly contain expensive elements like silver, rare-earth elements and/or Tellurium This thermoelectric material, nanostructured $Cu_2Se$, contains constituent elements that are relatively non-toxic, in contrast to most of the existing high figure-of-merit materials which contain Lead, which is very toxic.

We claim:

1. A nanostructured copper-selenide having a formula of $Cu_xSe_{x-1}$, wherein X has an atomic ratio in the range of 1.99 to 2.01, and wherein the copper-selenide is a p-type thermoelectric material with a high thermoelectric figure-of-merit of 2 at 973K.

2. The nanostructured copper-selenide of claim 1, wherein the nanostructured copper-selenide has an average crystallite size in the range of 5 nm to 30 nm.

3. A process for the synthesis of the nanostructured copper-selenide of claim 1 comprising the steps of:
   i. mixing copper (Cu) and selenium (Se) powders in an atomic ratio ranging between 1.97 to 2.03 to obtain a mixture;
   ii. milling the mixture as obtained in step (i) by using balls in a high energy ball mill with a 2 to 4 weight percent process control reagent at a speed of 300 to 400 rpm for a period in the range of 40 to 70 hours to obtain a Cu and Se nanopowder;
   iii. compacting the Cu and Se nanopowder as obtained in step (ii) on a hydraulic press at a pressure of 0.3 to 0.5 MPa to obtain a compacted pellet;
   iv. consolidating the compacted pellet as obtained in step (iii) using a spark plasma sintering process in a vacuum for a period in the range of 3 to 5 minutes followed by cooling and releasing the pressure to obtain nanostructured copper-selenide.

4. The process of claim 3, wherein a ball to powder weight ratio in the range of 15:1 to 20:1 is used in the high energy ball mill of step (ii).

5. The process of claim 3, wherein the Cu and Se nanopowder is compacted in a 12.7 mm inner diameter high strength graphite die.

6. The process of claim 3, wherein the 2 to 4 weight percent process control reagent is stearic acid.

7. The process of claim 3, wherein the spark plasma sintering process is carried out at a pressure of 50 to 80 MPa.

8. The process of claim 3, wherein the spark plasma sintering process is carried out at a temperature in the range of 800 to 900 K with a heating rate of 300 to 450 K/min in a vacuum of 3 to 8 Pa in a high-strength graphite die.

9. The process of claim 3, wherein the milling is carried out in an inert atmosphere of argon gas.

* * * * *